(12) United States Patent
Nebhrajani et al.

(10) Patent No.: US 8,466,711 B2
(45) Date of Patent: Jun. 18, 2013

(54) PROGRAMMABLE PRIORITY ENCODER

(75) Inventors: Vijay A. Nebhrajani, Sunnyvale, CA (US); Kenneth Michael Rose, Palo Alto, CA (US); David S. Walker, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 80 days.

(21) Appl. No.: 13/111,650

(22) Filed: May 19, 2011

(65) Prior Publication Data

US 2012/0293199 A1 Nov. 22, 2012

(51) Int. Cl.
*H03K 19/173* (2006.01)

(52) U.S. Cl.
USPC ......................................................... 326/38

(58) Field of Classification Search
USPC ............. 326/37–47, 101; 365/49.18; 341/160
See application file for complete search history.

(56) References Cited

U.S. PATENT DOCUMENTS

| | | | |
|---|---|---|---|
| 5,095,460 A | | 3/1992 | Rodeheffer |
| 7,219,188 B1 * | | 5/2007 | Pereira ........................... 711/108 |
| 2005/0001744 A1 * | 1/2005 | Roth et al. ........................ 341/50 |
| 2007/0019455 A1 * | 1/2007 | Lysinger .......................... 365/49 |
| 2007/0136514 A1 * | 6/2007 | Roth et al. ..................... 711/108 |
| 2008/0282135 A1 * | 11/2008 | Santou .......................... 714/801 |
| 2009/0251939 A1 * | 10/2009 | Kojima ....................... 365/49.18 |

OTHER PUBLICATIONS

Gupta et al., "Designing and Implementing a Fast Crossbar Scheduler," IEEE Micro, Jan.-Feb. 1999, pp. 20-28.

* cited by examiner

*Primary Examiner* — Thienvu Tran
(74) *Attorney, Agent, or Firm* — The Law Office of Kirk D. Williams

(57) ABSTRACT

In one embodiment, a programmable priority encoder is configured to receive inputs, including an ordered list of a plurality of input request values each representing either a request or a non-request, and a starting position within the ordered list of the plurality of input request values. The programmable priority encoder is configured to generate an identification of a result position of a first input indicating said request in order from a position identified from the starting position within the ordered list. In one embodiment, the programmable priority encoder includes a hierarchal structure of logic blocks including a plurality of columns of logic blocks; wherein a first-stage column of the plurality of columns of logic blocks is configured to operate on at most N input values; and wherein the ordered list of the plurality of input request values consists of N input request values.

21 Claims, 7 Drawing Sheets

DETERMINING THE CONFIGURATION OF EACH LOGIC BLOCK
BASED ON THE STARTING POSITION

R/NR-0 | LP/HP-0

R/NR-1 | LP/HP-1

280

| | 00 | 01 | 11 | 10 |
|---|---|---|---|---|
| 00 | 0 | X | 1 | CFG |
| 01 | X | X | X | X |
| 11 | 1 | X | X | CFG |
| 10 | 0 | X | 0 | 0 |

OUTPUT = PRE-LP/HP

WHERE LP/HP = PRE-LP/HP & (R/NR-0 | R/NR-1)

| | 00 | 01 | 11 | 10 |
|---|---|---|---|---|
| 00 | 0 | X | 0 | 0 |
| 01 | X | X | X | X |
| 11 | 1 | X | X | 0 |
| 10 | 1 | X | 1 | CFG |

OUTPUT = ADDRESS BIT

FIGURE 2D

PROGRAMMABLE PRIORITY ENCODER

TECHNICAL FIELD

The present disclosure relates generally to programmable priority encoders.

BACKGROUND

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology.

A priority encoder is a device that processes signals received at its input ports, and identifies the highest priority port on which a signal is asserted. The priority order of the ports in a priority encoder is fixed. For example, a priority encoder has M inputs labeled zero to M−1. This priority encoder will generate the address of the lowest numbered port on which an asserted signal is received during that decision cycle. Thus, input zero will always be selected if an asserted signal is received thereon.

In contrast, the starting position of a programmable priority encoder is variable, and is received as a parameter to the logic of the programmable priority encoder. For example, a programmable priority encoder has M inputs labeled zero to M−1. This priority encoder receives as an input for each decision cycle a starting position value ranging from 0 to M−1. This programmable priority encoder will generate the address of the first port at or after (with the order wrapping around from M−1 to zero) the starting position input value. This dynamic starting position of the ordering of input ports in the programmable priority encoder adds a certain amount of fairness in a sequence of decision cycles.

BRIEF DESCRIPTION OF THE DRAWINGS

The appended claims set forth the features of one or more embodiments with particularity. The embodiment(s), together with its advantages, may be best understood from the following detailed description taken in conjunction with the accompanying drawings of which:

FIGS. 2A-D illustrates a programmable priority encoder according to one embodiment;

DESCRIPTION OF EXAMPLE EMBODIMENTS

1. Overview

Figure 1A:
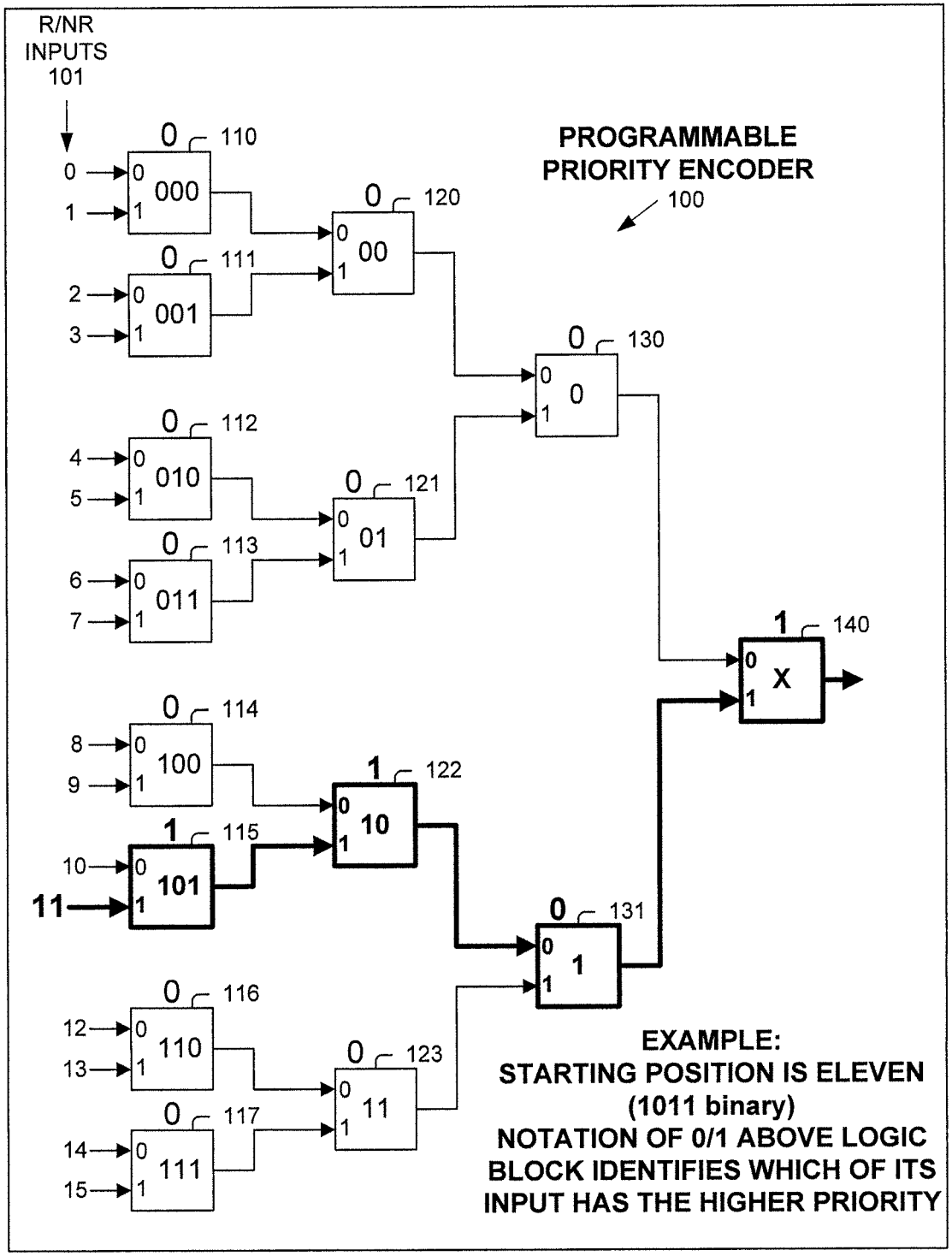
FIG. 1A illustrates a programmable priority encoder according to one embodiment.

Disclosed are, inter alia, methods, apparatus, computer-storage media, mechanisms, and means associated with a programmable priority encoder. One embodiment includes a programmable priority encoder configured to receive inputs, including an ordered list of a plurality of input request values each representing either a request or a non-request, and a starting position within the ordered list of the plurality of input request values; wherein the programmable priority encoder is configured to generate an identification of a result position of a first input indicating said request in order from a position identified from the starting position within the ordered list;

In one embodiment, the programmable priority encoder includes a hierarchal structure of logic blocks including a plurality of columns of logic blocks; wherein a first-stage column of the plurality of columns of logic blocks is configured to operate on at most N input values; and wherein the ordered list of the plurality of input request values consists of N input request values.

In one embodiment, the identification of the result position is determined by a concatenation of values representing one determined logic block from each of the plurality of columns of logic blocks.

In one embodiment, the ordered list of input request values consists of N input request values; and wherein the programmable priority encoder is configured to generate the identification of the result position without duplicating the ordered list of input request values.

In one embodiment, the hierarchal structure of logic blocks is in the form of a binary tree. In one embodiment, the plurality of columns of logic blocks consists of C columns, with the first column of said C columns configured to receive said N input request values; and wherein the second column of said C columns is configured to operate on N/2 of said N input request values. In one embodiment, each logic block of the hierarchal structure of logic blocks is configured to receive and operate on a different particular plurality of the plurality of input request values, with each logic block of the hierarchal structure of logic blocks being configured to determine the ordering within the ordered list of said different particular plurality of the plurality of input request values based on the starting position.

2. Description

Disclosed are, inter alia, methods, apparatus, computer-storage media, mechanisms, and means associated with a programmable priority encoder. Embodiments described herein include various elements and limitations, with no one element or limitation contemplated as being a critical element or limitation. Each of the claims individually recites an aspect of the embodiment in its entirety. Moreover, some embodiments described may include, but are not limited to, inter alia, systems, networks, integrated circuit chips, embedded processors, ASICs, methods, and computer-readable media containing instructions. One or multiple systems, devices, components, etc. may comprise one or more embodiments, which may include some elements or limitations of a claim being performed by the same or different systems, devices, components, etc. A processing element may be a general processor, task-specific processor, or other implementation for performing the corresponding processing. The embodiments described hereinafter embody various aspects and configurations, with the figures illustrating exemplary and non-limiting configurations. Note, computer-readable media and means for performing methods and processing block operations (e.g., a processor and memory or other apparatus configured to perform such operations) are disclosed and are in keeping with the extensible scope and spirit of the embodiments. Note, the term "apparatus" is used consistently herein with its common definition of an appliance or device.

Note, the steps, connections, and processing of signals and information illustrated in the figures, including, but not limited to, any block and flow diagrams and message sequence charts, may typically be performed in the same or in a different serial or parallel ordering and/or by different components and/or processes, threads, etc., and/or over different connections and be combined with other functions in other embodiments, unless this disables the embodiment or a sequence is explicitly or implicitly required (e.g., for a sequence of read the value, process said read value—the value must be obtained prior to processing it, although some of the associated processing may be performed prior to, concurrently with, and/or after the read operation). Also note, nothing described or referenced in this document is admitted as prior art to this application unless explicitly so stated.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. Additionally, the phrases "based on x" and "in response to x" are used to indicate a minimum set of items "x" from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. Moreover, the term "or" is used herein to identify a selection of one or more, including all, of the conjunctive items. Additionally, the transitional term "comprising," which is synonymous with "including," "containing," or "characterized by," is inclusive or open-ended and does not exclude additional, unrecited elements or method steps. Finally, the term "particular machine," when recited in a method claim for performing steps, refers to a particular machine within the 35 USC §101 machine statutory class.

Expressly turning to the figures, FIG. 1A illustrates a programmable priority encoder 100 of one embodiment. As shown, programmable priority encoder 100 includes sixteen inputs 101, which receive a request or no request signal (R/NR). Of course, an embodiment can have more or fewer inputs, with sixteen chosen for illustrative purposes. Further as shown, programmable priority encoder 100 is comprised of fifteen logic blocks 110-140, arranged in a tree structure having four columns. In particular, logic blocks 110-140 are arranged in a binary tree structure, with each of logic blocks 110-140 having two inputs, either received externally generated signals (R/NR inputs 101) or from a child logic block. As used herein, a particular logic block is a parent of another logic block if it receives its input values from the another logic block. Note, this another logic block can be referenced as a child of the particular logic block.

As shown in FIG. 1A, programmable priority encoder 100 operates on the same number N of R/NR signals 101 which it receives, and each subsequent stage operations on half of the previous number of inputs when using two-input logic blocks. Note, embodiments are not limited to two-input logic blocks, as the teachings herein apply to other embodiments designed and implemented based on the needs of the application of the programmable priority encoder. For example, four-input R/NR logic blocks could be used instead of the two-input R/NR logic blocks 110-140 illustrated in FIG. 1A.

Other programmable priority encoders duplicate the received order of N signals, and basically operate as a priority encoder on 2N signals by masking some of the 2N signals to adjust its operation according to the programmable starting position. However, an embodiment of programmable priority encoder 100 is more scalable and can require less implementation real estate, as it does not duplicate the input signals, nor require the additional logic blocks (possibly twice as many), masking logic, and/or other hardware to process the original plus duplicated input signals.

Programmable priority encoder 100 adjusts its operation according to the input starting position by possibly adjusting the operation of logic blocks corresponding to those logic blocks along the path of travel for an input at the starting position through each of the columns of programmable priority encoder 100. When the starting position is at input zero (R/NR inputs 101), all logic blocks 110-140 mimic the operation of a priority encoder with the priority ordering of ports being zero to fifteen.

For explanation purposes, FIG. 1A illustrates an example configuration of programmable priority encoder 100, wherein the starting position is eleven. The notation above each of logic blocks 110-140 indicates which of its respective input ports has the higher priority. For example, input port eleven of programmable priority encoder 100 corresponds to input port one of logic block 115; hence, the notation of the one above logic block 115. Note, all of logic blocks 110-140 have a zero above them, except possibly one logic block from each column along the particular path from the port corresponding to the starting position through logic blocks (115, 122, 131) to the root logic block (140). This configuration, determined based on the starting position, allows the operation of logic blocks 115, 122, 131, and 140 to possibly "trump" the normal priority encoding operation (where port 0 has a higher priority than port one of a logic block) to cause the ordered priority sequence of R/NR inputs 101 to be highest at the starting position. Thus, in this example, the priority ordering of R/NR inputs 101 is the sequence of eleven, twelve . . . fifteen, zero, one . . . ten. Thus, if both inputs ten and eleven (of R/NR inputs 101) are asserted in this example, the selection of port eleven over port ten in logic block 115 occurs (i.e., port eleven trumps port ten in logic block 115). A similar operation occurs at logic blocks 122, 131, and 140 to adjust the operation of programmable priority encoder 100 based on the current starting position.

Further note, there is some additional information that is passed among logic blocks (115, 122, 131, 140) along this particular path, with that being whether or not this higher priority adjustment or selection by "trumping" is performed. This extra information is used to adjust for situations, such as where the starting position is eleven, input ten is asserted and input eleven is not. In such case, logic block 115 will select input port ten (of N/NR inputs 101), which is actually the lowest-priority N/NR input 101 when the starting position is eleven. Subsequent stages along the decision path (e.g., logic blocks 122, 131, and 140) must not "trump" other results to select port ten (wherein they would "trump" other results to select port eleven). This additional information and operation based thereon will be further explained hereinafter.

In one embodiment, the address of the selected R/NR input 101 is passed among logic blocks 110-140. In one embodiment, the address of the selected R/NR input 101 is not passed among logic blocks 110-140, but is rather derived from the decisions made by logic blocks 110-140.

Figure 1B:
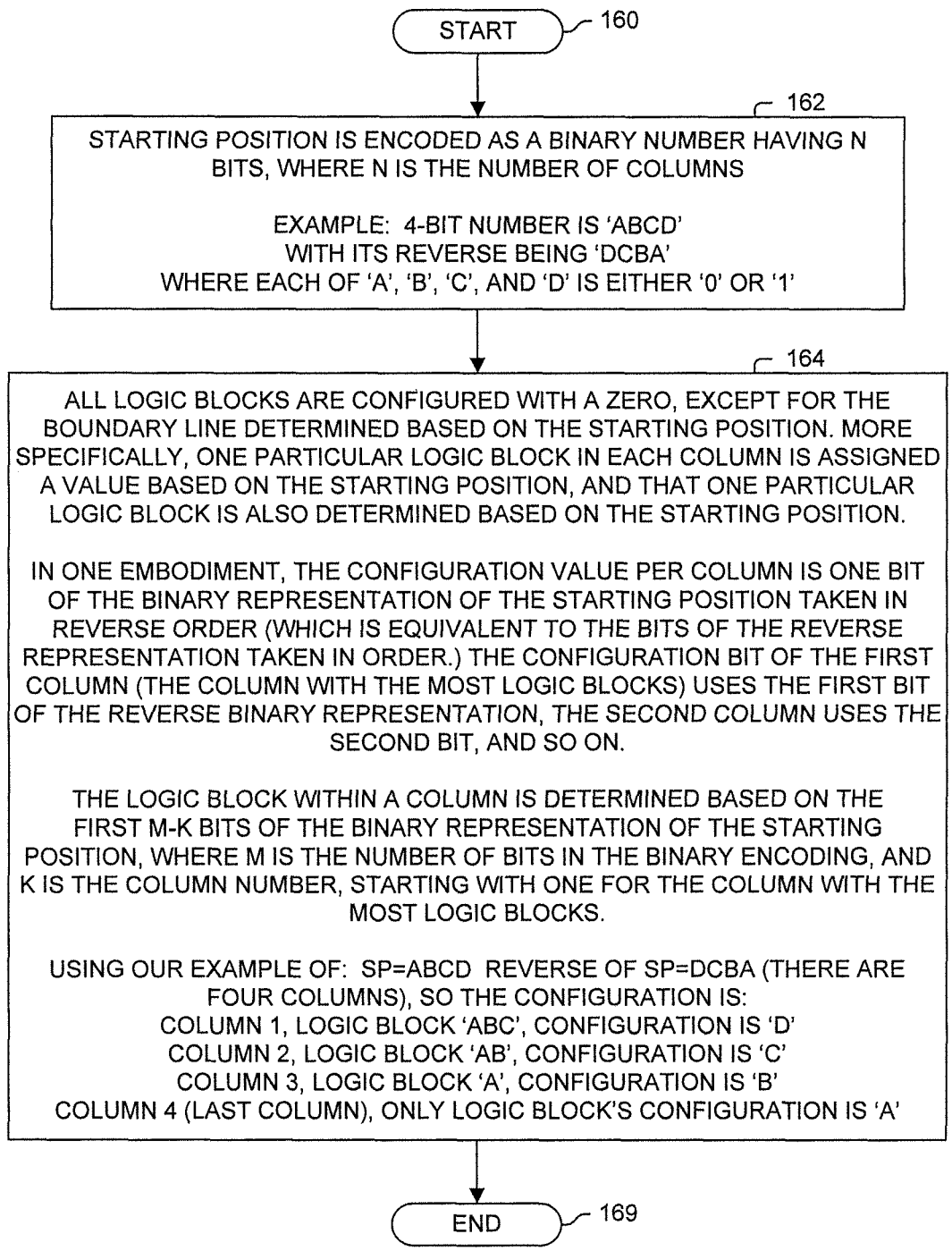
FIG. 1B illustrates a process performed in one embodiment.

As discussed in relation to FIG. 1A, the operation of certain logic blocks is adjusted to accommodate the starting position. In accomplishing this, one embodiment uses the process, or a variant thereof, of that illustrated in FIG. 1B. Turning to FIG. 1B, processing begins with process block 160.

In process block 162, the starting position is encoded as a binary number having N bits, where N is the number of columns in the programmable priority encoder. For example, let's assume there are four columns and the binary encoding of the starting position is ABCD, where each of A, B, C and D is a bit having a value of one or zero. Further, the reverse of binary number ABCD is DCBA.

In process block 164, all logic blocks are configured with a configuration bit of zero (e.g., normal priority encoding operation without "trumping" operations), except possibly for the logic blocks along the boundary line determined based on the starting position. More specifically, one particular logic block in each column is assigned a value based on the starting position, and that one particular logic block is also determined based on the starting position.

In one embodiment, the configuration value per column is one bit of the binary representation of the starting position taken in reverse order (which is equivalent to the bits of the reverse representation taken in order.) The configuration bit of the first column (the column with the most logic blocks) uses the first bit of the reverse binary representation, the second column uses the second bit, and so on.

The logic block within a column is determined based on the first M-K bits of the binary representation of the starting position, where M is the number of bits in the binary encoding, and K is the column number, starting with one for the column with the most logic blocks. The logic blocks within a column, except for the last column having a single logic block, are sequentially numbered from zero to $2^{M-K}-1$ with zero denoting the logic block having R/RN input zero, and $2^{M-K}-1$ denoting the logic block having the R/RN input labeled with the largest number. In a binary implementation, this largest number is $2^{M-K-1}-1$. For example, as shown in FIG. 1A, this number of logic blocks 110-131 is denoted in the center of each of these blocks (e.g., logic block 110 is numbered 000 binary, logic block 117 is numbered 111 binary, logic block 122 is labeled 01 binary, etc.).

Thus, for example in a four-column programmable priority encoder, assume a binary representation of the starting position as ABCD. The reverse of this binary encoding is DCBA. So, the configuration is:
  column 1, logic block ABC, configuration value is D
  column 2, logic block AB, configuration is C
  column 3, logic block A, configuration is B
  column 4 (last column), only logic block's configuration is A.

For further example, let's determine the configuration for our previous example of the starting position being eleven in relation to programmable priority encoder 100 (FIG. 1A). The binary representation of the starting position of eleven is 1011. The reverse of this binary encoding is 1101. There are four columns in the programmable priority encoder. So, the configuration is:
  column 1, logic block 101 binary (five decimal), configuration value is 1
  column 2, logic block 10 (two decimal), configuration is 1
  column 3, logic block 1, configuration is 0
  column 4 (last column), only logic block's configuration is 1.
This determined information is pictorially represented in FIG. 1A.

Therefore, the configuration of a programmable priority encoder of one embodiment is readily determined based on the starting value. Additionally, as this configuration is deterministic based only on the starting position, for an N-input programmable priority encoder, there are only N different configurations of the programmable priority encoder. Hence, one embodiment pre-computes these N different configurations and stores them in a configuration table, such as one indexed based on the value of the starting position.

Figure 2A:
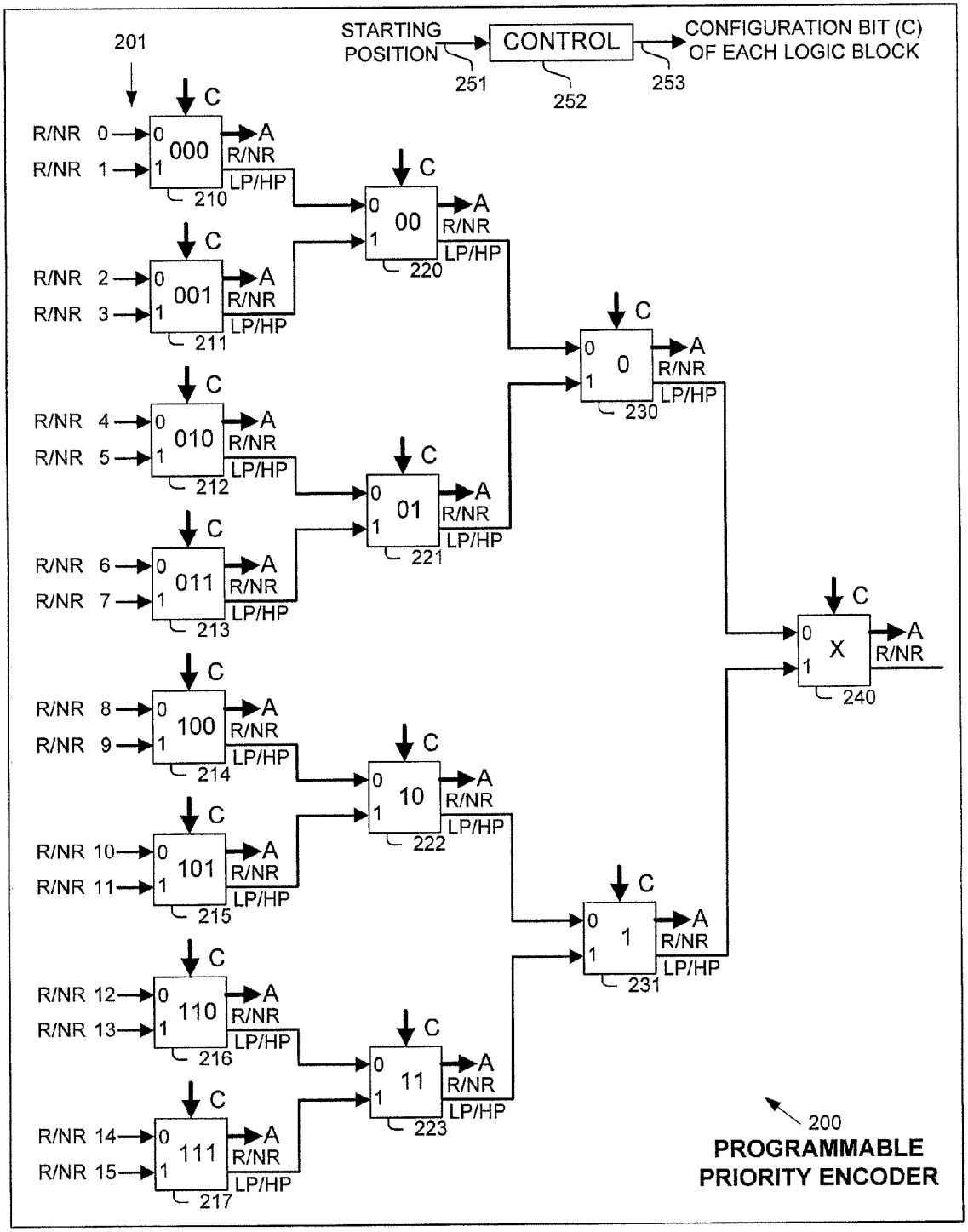

FIG. 2A illustrates a programmable priority encoder 200 according to one embodiment. As shown, programmable priority encoder 200 receives a starting position value 251, and based thereon, control 252 generates each configuration bit (C) provided to logic blocks 210-240. For example in relation to FIG. 1A, a corresponding configuration bit (C) is the value shown on top of each of logic blocks 110-140 for programmable priority encoder 100 configured for a starting position of eleven.

Returning to FIG. 2A, each of logic blocks 210-240 is configured to receive two different request/no request values (R/NR) 201. Note, if programmable priority encoder 200 is used in a configuration where less than sixteen inputs are needed, those unused ones are simply always provided a NR (no request) signal.

As mentioned in regards to FIG. 1A, additional information is communicated through an embodiment of a programmable priority encoder to indicate to a next stage whether or not a value was selected based on a "trumping" operation, due to the current value of the starting position. As shown in FIG. 2A, this information is labeled as LP/HP (low-priority or high-priority), where high-priority corresponds to the use of the trumping operation in selecting the higher priority request of a logic block.

Additionally, as mentioned in relation to FIG. 1A, the selected addresses are propagated through logic block stages of the programmable priority encoder in one embodiment, with the overall parent logic block in the last stage/column of the programmable priority encoder generating as an output the address of the highest-priority port having received a request (e.g., an asserted input value) thereon. However, one embodiment simplifies the operation of programmable priority encoder 200 by having each logic block 210-240 generate an indication of which of its inputs it selected, and then these are selectively concatenated together to generate the output the address of the highest-priority port having received a request (e.g., an asserted input value) thereon. This address selection and concatenation operation is explained further hereinafter in relation to FIG. 3.

Figure 2B:
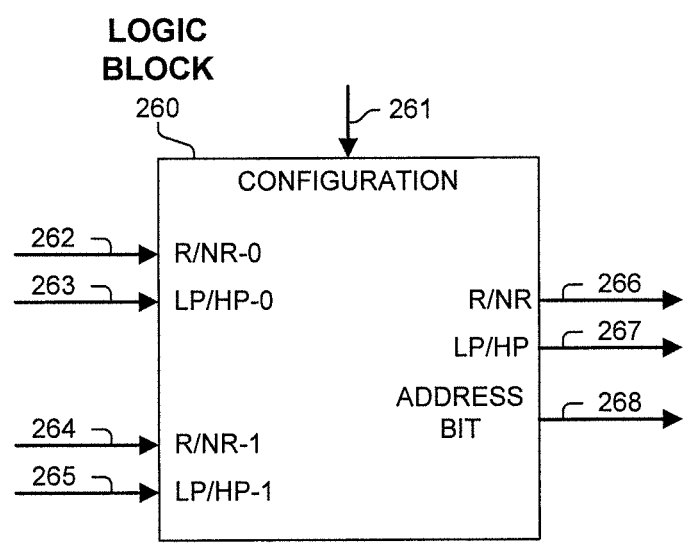

FIG. 2B illustrates a logic block 260 used in one embodiment. Note, in one embodiment, each of logic blocks 210-240 of FIG. 2A corresponds to logic block 260. Implementing all logic blocks 210-240 using a same logic block, as done in one embodiment, simplifies engineering and fabrication. As shown, logic block 260 receives a configuration bit 261 (as discussed herein). Additionally, logic block 260 receives two R/NR inputs 262 and 264, each with a corresponding further value (263, 265) defining whether the prior result was generated via the "trumping" operation (e.g., it is either a low-priority (LP) result, or high-priority (HP) result which would only be used on the corresponding path identified through the programmable priority encoder based on the starting value). These LP/HP inputs 263 and 265 are tied to signal LP for the first stage of a programmable priority encoder.

Based on these inputs 261-265, logic block 260 generates outputs: R/NR request 266, LP/HP 267 and address bit 268. Output R/NR request 266 has a value of R/request (e.g., 1) when either of inputs 262 or 264 receives an R/request signal.

Output LP/HP 267 is determined based on Karnaugh map 280 of FIG. 2C. If the logic blocks does not receive a request on either or its inputs, LP/HP 267 is set to LP (e.g., 0).

Otherwise, it is set to the value determined by Karnaugh map 280, where CFG refers to input configuration bit 261, and 'X' is a don't care case.

Output address bit 268 is determined based on Karnaugh map 290 of FIG. 2D, where CFG refers to input configuration bit 261, and 'X' is a don't care case.

Figure 3:
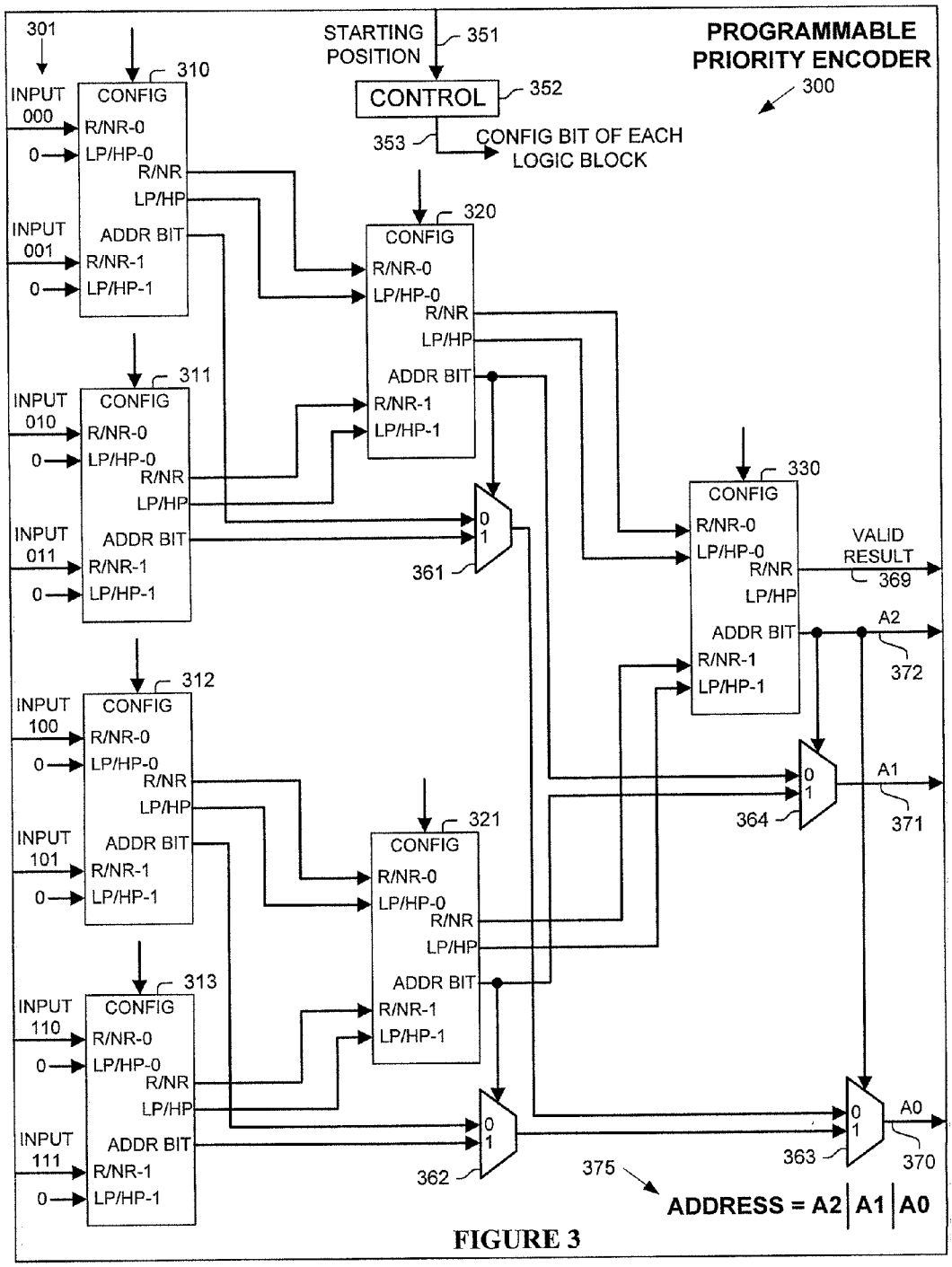
FIG. 3 illustrates a programmable priority encoder according to one embodiment.

FIG. 3 illustrates one embodiment of programmable priority encoder 300, with each of logic blocks 310-330 corresponding to logic block 260 of FIG. 2B. As shown, programmable priority encoder 300 receives a starting position value 351, and based thereon, control 352 generates each configuration bit (C) provided to logic blocks 310-340. The LP/HP inputs (301) of each of first-column/first-stage logic blocks 310-313 are tied to LP (e.g., 0). Each of request inputs (301) receives corresponding request/no request signals from which programmable priority encoder 300 will generate the address 375 of the highest-priority port having a request asserted thereon. Each of control blocks 310-330 operate as described herein. In particular, output valid result signal 369 signals a valid result (e.g., value of one) if any of request signal was asserted on an input of any of control blocks 310-313.

Finally, the binary address of the highest-priority input port (determined based on the starting position) having a request asserted thereon is generated by concatenating the values of A2 (372), A1 (371), and A0 (370), with A2 being the most-significant bit, and A0 being the least significant bit. As shown, A2 (372) is simply the address bit generated by control block 330 (the control block in the last column). This value (372) is further used to select the values of address bits A1 (371) and A0 (370) via multiplexers 364 and 363, respectively. Multiplexer 364 selects the address bit generated by either control blocks 320 or 321, with each of these address bits selecting (by controlling multiplexers 361 and 262 as shown) between the address bits generated in the previous stage (e.g., previous column) by control blocks 310-313. Multiplexer 363, in conjunction with multiplexers 361 and 362, selects among the address bits generated in next previous stage (e.g., first column in this embodiment) by control blocks 310-313. This same address bit selection process is extensible to any number of stages in a programmable priority encoder.

Figure 4:
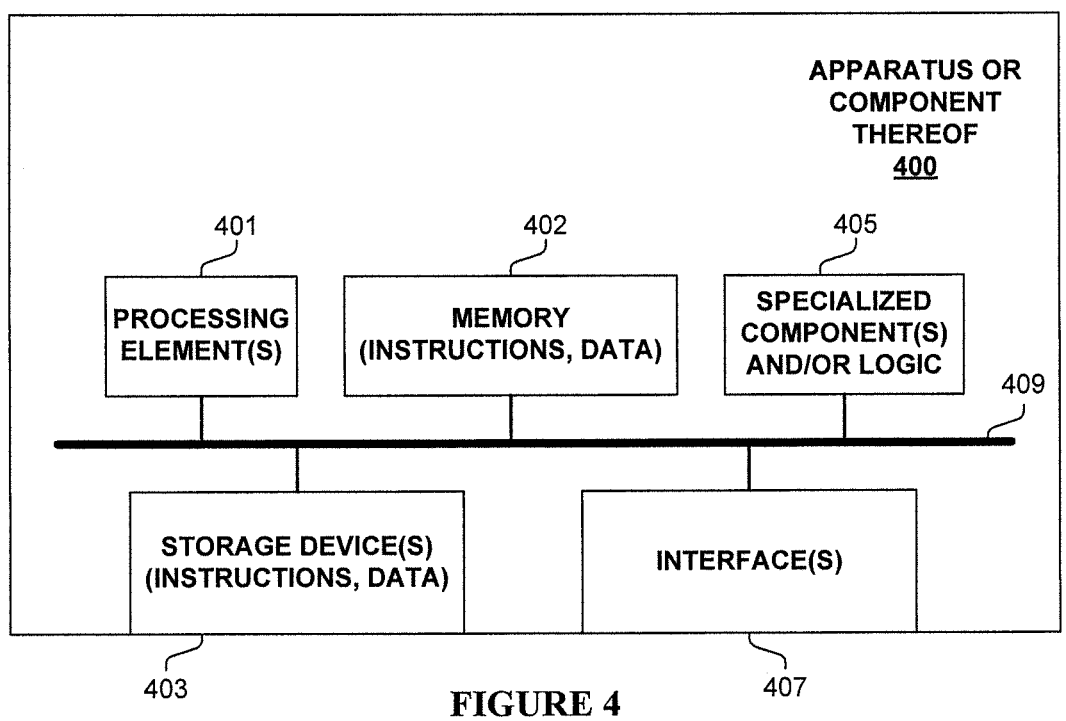
FIG. 4 illustrates an apparatus or component used in one embodiment.

FIG. 4 is a block diagram of an apparatus or component 400 used in one embodiment associated with a programmable priority encoder, such as a device including a programmable priority encoder, or a programmable priority encoder itself or a portion thereof. In one embodiment, apparatus or component 400 performs one or more processes corresponding to one of the flow, block, or other diagrams illustrated or otherwise described herein.

In one embodiment, apparatus or component 400 includes one or more processing element(s) 401, memory 402, storage device(s) 403, specialized component(s) 405 (e.g. optimized hardware such as for performing operations, etc.), and interface(s) 407 for communicating information, which are typically communicatively coupled via one or more communications mechanisms 409, with the communications paths typically tailored to meet the needs of a particular application. In one embodiment apparatus or component 400 corresponds to, or is part of, control 352 or control blocks 310-330 of programmable priority encoder 300 of FIG. 3.

Various embodiments of apparatus or component 400 may include more or fewer elements. The operation of apparatus or component 400 is typically controlled by processing element(s) 401 using memory 402 and storage device(s) 403 to perform one or more tasks or processes. Memory 402 is one type of computer-readable/computer-storage medium, and typically comprises random access memory (RAM), read only memory (ROM), flash memory, integrated circuits, and/or other memory components. Memory 402 typically stores computer-executable instructions to be executed by processing element(s) 401 and/or data which is manipulated by processing element(s) 401 for implementing functionality in accordance with an embodiment. Storage device(s) 403 are another type of computer-readable medium, and typically comprise solid state storage media, disk drives, diskettes, networked services, tape drives, and other storage devices. Storage device(s) 403 typically store computer-executable instructions to be executed by processing element(s) 401 and/or data which is manipulated by processing element(s) 401 for implementing functionality in accordance with an embodiment.

In view of the many possible embodiments to which the principles of our invention may be applied, it will be appreciated that the embodiments and aspects thereof described herein with respect to the drawings/figures are only illustrative and should not be taken as limiting the scope of the invention. For example, and as would be apparent to one skilled in the art, many of the process block operations can be re-ordered to be performed before, after, or substantially concurrent with other operations. Also, many different forms of data structures could be used in various embodiments. The invention as described herein contemplates all such embodiments as may come within the scope of the following claims and equivalents thereof.

What is claimed is:

1. An apparatus, comprising:
a programmable priority encoder configured to receive inputs, including an ordered list of a plurality of input request values each representing either a request or a non-request, and a starting position within the ordered list of the plurality of input request values; wherein the programmable priority encoder is configured to generate an identification of a result position of a first input indicating said request in order from a position identified from the starting position within the ordered list;
wherein the programmable priority encoder includes a hierarchal structure of logic blocks including a plurality of columns of logic blocks;
wherein a first-stage column of the plurality of columns of logic blocks is configured to operate on at most N input values;
wherein the ordered list of the plurality of input request values consists of N input request values; and wherein the starting position is not a position of the first or the last input request value in the ordered list of the plurality of input request values.

2. The apparatus of claim 1, wherein the identification of the result position is determined by a concatenation of values representing one determined logic block from each of the plurality of columns of logic blocks.

3. The apparatus of claim 2, wherein the hierarchal structure of logic blocks is in the form of a binary tree.

4. The apparatus of claim 3, wherein the plurality of columns of logic blocks consists of C columns, with the first column of said C columns configured to receive said N input request values; and wherein the second column of said C columns is configured to operate on N/2 of said N input request values.

5. The apparatus of claim 3, wherein each logic block of the hierarchal structure of logic blocks is configured to receive and operate on a different particular plurality of the plurality of input request values, with each logic block of the hierarchal structure of logic blocks being configured to determine the ordering within the ordered list of said different particular plurality of the plurality of input request values based on the starting position.

6. An apparatus, comprising:
a programmable priority encoder configured to receive inputs, including an ordered list of a plurality of input request values each representing either a request or a non-request, and a starting position within the ordered list of the plurality of input request values; wherein the programmable priority encoder is configured to generate an identification of a result position of a first input indicating said request in order from a position identified from the starting position within the ordered list;
wherein the programmable priority encoder includes a hierarchal structure of logic blocks, with the hierarchical structure including a plurality of columns of logic blocks; wherein the identification of the result position is determined by a concatenation of values representing one determined logic block from each of the plurality of columns of logic blocks; and wherein the starting position is not a position of the first or the last input request value in the ordered list of the plurality of input request values.

7. The apparatus of claim 6, wherein the ordered list of input request values consists of N input request values; and wherein the programmable priority encoder is configured to said generate the identification of the result position without duplicating the ordered list of input request values.

8. The apparatus of claim 6, wherein a first-stage column of the plurality of columns of logic blocks is configured to operate on at most N input values; and wherein the ordered list of the plurality of input request values consists of N input request values.

9. The apparatus of claim 6, wherein the hierarchal structure of logic blocks is in the form of a binary tree.

10. The apparatus of claim 9, wherein the plurality of columns of logic blocks consists of C columns, with the first column of said C columns configured to receive said N input request values; and wherein the second column of said C columns is configured to operate on N/2 of said N input request values.

11. The apparatus of claim 6, wherein each logic block of the hierarchal structure of logic blocks is configured to receive and operate on a different particular plurality of the plurality of input request values, with each logic block of the hierarchal structure of logic blocks being configured to determine the ordering within the ordered list of said different particular plurality of the plurality of input request values based on the starting position.

12. An apparatus, comprising:
a programmable priority encoder configured to receive inputs, including an ordered list of a plurality of input request values each representing either a request or a non-request, and a starting position within the ordered list of the plurality of input request values; wherein the programmable priority encoder is configured to generate an identification of a result position of a first input indicating said request in order from a position identified from the starting position within the ordered list;
wherein each logic block of the hierarchal structure of logic blocks is configured to receive and operate on a different particular plurality of the plurality of input request values, with each logic block of the hierarchal structure of logic blocks being configured to determine the ordering within the ordered list of said different particular plurality of the plurality of input request values based on the starting position; and wherein the starting position is not a position of the first or the last input request value in the ordered list of the plurality of input request values.

13. The apparatus of claim 12, wherein the ordered list of input request values consists of N input request values; and wherein the programmable priority encoder is configured to said generate the identification of the result position without duplicating the ordered list of input request values.

14. The apparatus of claim 12, wherein the programmable priority encoder includes a hierarchal structure of logic blocks including a plurality of columns of logic blocks; wherein a first-stage column of the plurality of columns of logic blocks is configured to operate on at most N input values; and wherein the ordered list of the plurality of input request values consists of N input request values.

15. The apparatus of claim 12, wherein the hierarchal structure of logic blocks is in the form of a binary tree.

16. The apparatus of claim 15, wherein the programmable priority encoder includes a hierarchal structure of logic blocks including a plurality of columns of logic blocks; wherein the plurality of columns of logic blocks consists of C columns, with the first column of said C columns configured to receive said N input request values; and wherein the second column of said C columns is configured to operate on N/2 of said N input request values.

17. The apparatus of claim 12, wherein the identification of the result position is determined by a concatenation of values representing one determined logic block from each of the plurality of columns of logic blocks.

18. A method, comprising:
performing operations in an apparatus including a programmable priority encoder, which includes a hierarchal structure of a plurality of logic blocks including a plurality of columns of logic blocks; wherein said operations include:
configuring, based on a starting position within an ordered list of a plurality of input request values, a priority ordering of a plurality of inputs of each of the plurality of logic blocks;
receiving, by the programmable priority encoder, an ordered list of a plurality of input request values each representing either a request or a non-request;
generating an identification of a result position of a first input indicating said request in order from a position identified from the starting position within the ordered list; and wherein the starting position is not a position of the first or the last input request value in the ordered list of the plurality of input request values.

19. The method of claim 18, wherein the ordered list of input request values consists of N input request values; and wherein the programmable priority encoder is configured to said generate the identification of the result position without duplicating the ordered list of input request values.

20. The method of claim 18, wherein a first-stage column of the plurality of columns of logic blocks is configured to operate on at most N input values; and wherein the ordered list of the plurality of input request values consists of N input request values.

21. The method of claim 18, wherein the identification of the result position is determined by a concatenation of values representing one determined logic block from each of the plurality of columns of logic blocks.

* * * * *